US010067178B2

(12) United States Patent
Duke et al.

(10) Patent No.: US 10,067,178 B2
(45) Date of Patent: Sep. 4, 2018

(54) TWO-STEP SELF-TEST CIRCUIT FOR MICROCONTROLLER UNIT AND ANTENNA

(71) Applicant: Southwire Company, LLC, Carrollton, GA (US)

(72) Inventors: Richard Allan Duke, Rock Falls, IL (US); John Lawrence Payne, Newnan, GA (US)

(73) Assignee: SOUTHWIRE COMPANY, LLC, Carrollton, GA (US)

( * ) Notice: Subject to any disclaimer, the term of this patent is extended or adjusted under 35 U.S.C. 154(b) by 0 days.

(21) Appl. No.: 15/674,711

(22) Filed: Aug. 11, 2017

(65) Prior Publication Data
US 2018/0052195 A1 Feb. 22, 2018

Related U.S. Application Data

(60) Provisional application No. 62/375,563, filed on Aug. 16, 2016.

(51) Int. Cl.
G01R 31/28 (2006.01)
G01R 29/10 (2006.01)
G01R 35/00 (2006.01)
G01R 19/155 (2006.01)
G01R 15/18 (2006.01)
G01R 19/145 (2006.01)
G01R 31/02 (2006.01)

(52) U.S. Cl.
CPC ....... *G01R 31/2829* (2013.01); *G01R 19/155* (2013.01); *G01R 29/10* (2013.01); *G01R 31/2884* (2013.01); *G01R 35/00* (2013.01); *G01R 15/18* (2013.01); *G01R 19/145* (2013.01); *G01R 31/026* (2013.01)

(58) Field of Classification Search
CPC ............ G01R 31/2829; G01R 31/2884; G01R 29/10; G01R 19/145
USPC .......................................... 324/537
See application file for complete search history.

(56) References Cited

U.S. PATENT DOCUMENTS 4,743,847 A * 5/1988 Frushour ............ G01R 31/2805
324/537
7,733,078 B2 6/2010 Duke
(Continued)

FOREIGN PATENT DOCUMENTS

WO 2010141749 A1 12/2010

OTHER PUBLICATIONS

International Search Report dated Nov. 14, 2017 cited in Application No. PCT/US2017/046591, 17 pgs.

*Primary Examiner* — Melissa Koval
*Assistant Examiner* — Rahul Maini
(74) *Attorney, Agent, or Firm* — Merchant & Gould P.C.

(57) ABSTRACT

A system is disclosed. The system includes an antenna and a processor. The processor has at least four ports: a first input port coupled to a first portion of the continuity component; a first output port coupled in series to a first resistor coupled to the first portion of the antenna and to ground via a second resistor; a second output port coupled through a third resistor to the first portion of the antenna; and a second input port coupled to a second portion of the antenna and through a fourth resistor to ground. The processor is operable to activate and deactivate the appropriate ports to put the processor in one of three operating modes: an AC detection mode, an AC self-test mode, and a continuity test mode.

18 Claims, 7 Drawing Sheets

(56) References Cited

U.S. PATENT DOCUMENTS

| | | | |
|---|---|---|---|
| 8,362,783 B2* | 1/2013 | Baker | G01R 31/026 324/503 |
| 8,581,609 B2 | 11/2013 | Unmuessig et al. | |
| 2002/0077061 A1 | 6/2002 | Charrat | |

* cited by examiner

TWO-STEP SELF-TEST CIRCUIT FOR MICROCONTROLLER UNIT AND ANTENNA

RELATED APPLICATION

Under provisions of 35 U.S.C. § 119(e), Applicant claims the benefit of U.S. Provisional Application No. 62/375,563 filed Aug. 16, 2016, which is incorporated herein by reference in its entirety.

BACKGROUND

Electrical workers often have to work on electrical lines, and they need to ensure that the line is not hot or live. Thus, it becomes prudent and necessary to test whether a line is hot before work commences. An electrical worker will use a non-contact voltage ("NCV") detector to test whether the line is hot. These non-contact voltage detectors are useful because touching the line is not necessary in order to tell the voltage status of the line. However, non-contact voltage detectors can suffer from failures that may yield dangerous false negative results. For example, non-contact voltage detectors may have weak batteries or broken wiring at the antenna. Conventional non-contact voltage detectors fail to detect many of these fault conditions, resulting in potentially unsafe working conditions for electrical workers.

BRIEF DESCRIPTION OF THE FIGURES

The accompanying drawings, which are incorporated in and constitute a part of this disclosure, illustrate various embodiments of the present disclosure. In the drawings:

FIG. 7 is a third embodiment of a non-contact voltage detector and self-test circuitry similar.

DETAILED DESCRIPTION

Overview

Figure 1:
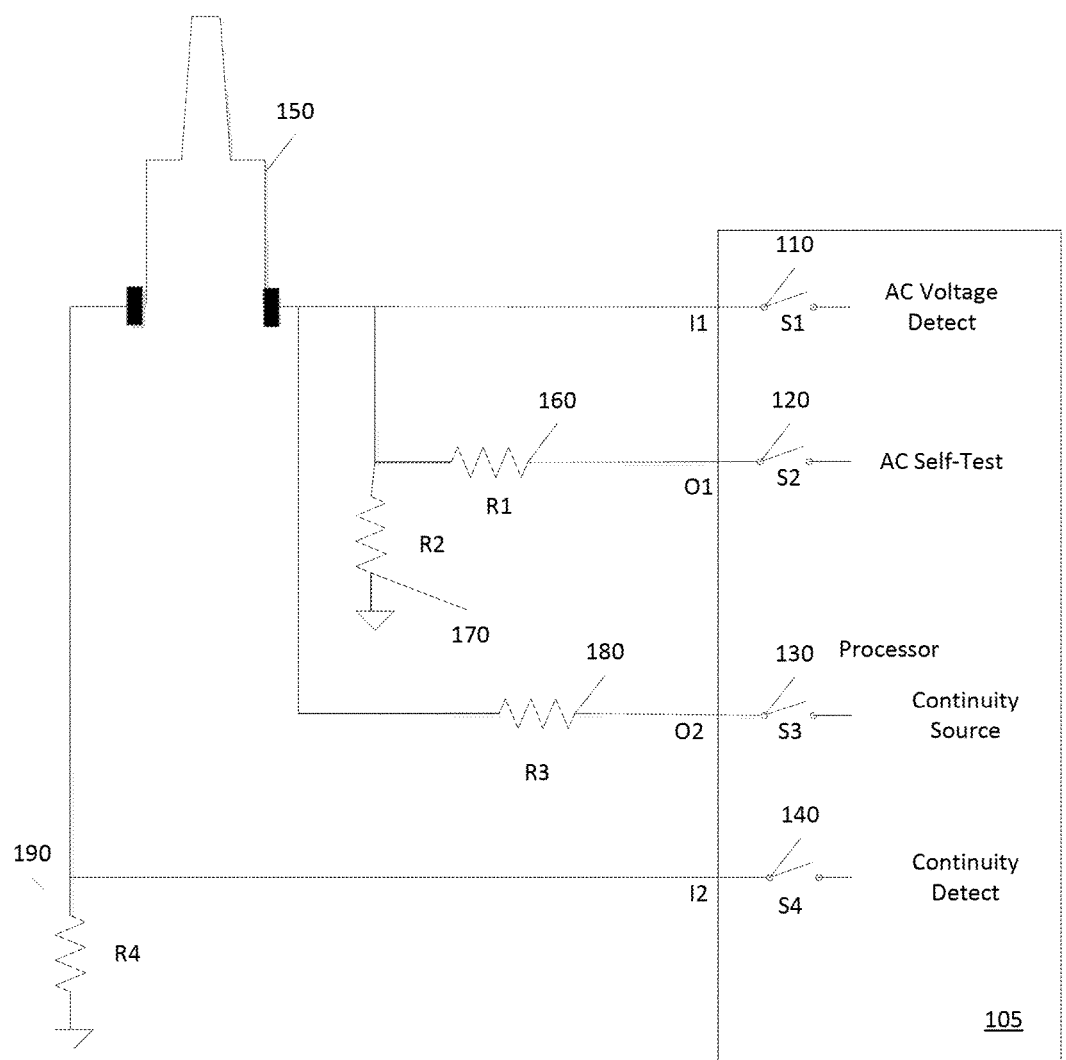
FIG. 1 illustrates an embodiment of a non-contact voltage detector 100 and self-test circuitry.

A two-step self-test apparatus and method has been devised for testing NCV detectors. While discussions of this embodiment will be with respect to NCV detectors, this testing device could be incorporated into other test equipment, including, but not limited to, clamp meters and multimeters, for example. As this technology may be incorporated into a wide range of critical circuits and components, it may provide for increasing the margin of safety for the user.

The embodiment disclosed performs AC signal path testing and antenna continuity verification in two independent stages. This allows each stage to be independently optimized to produce the most reliable results. The AC signal path testing may perform a more critical sensitivity test without concern of coupling between long parallel traces from a self-test source and detection circuitry on a printed circuit board. The antenna continuity verification may use a higher test current than is possible in prior art systems when injecting a simulated AC test signal into the antenna. This higher test current will be more effective in detecting marginal antenna connections to the printed circuit board than prior art systems. The embodiment employs a microcontroller unit ("MCU") or processor in conjunction with resistors and an antenna to capacitively couple to the conductor to be tested for AC voltage presence. A processor has a plurality of ports. A first port is used as an input for AC voltage detection from the antenna when the system is in an AC detection mode. A second port may be used to inject a signal through a resistor and into the first port when the system is in an AC self-test mode. A third and fourth port, in conjunction with a pair of resistors, may be used to inject a signal through the antenna when in a continuity test mode. Thus, the system may operate in two different testing modes: the AC self-test mode and the continuity test mode. The system may periodically enter these modes for short periods of time, e.g., less than 2 ms, during normal AC detection mode of operation or the test modes may be triggered by an end user.

The system includes an antenna and a processor. The processor has a plurality of ports: a first input port coupled to a first portion of the antenna; a first output port coupled in series to a first resistor coupled to the first portion of the antenna and to ground via a second resistor; a second output port coupled through a third resistor to the first portion of the antenna; and a second input port coupled to a second portion of the antenna and through a fourth resistor to ground. The processor is operable to activate and deactivate the appropriate ports to put the processor in one of three operating modes: an AC detection mode, a self-test mode, and a continuity test mode.

An alternative system includes an antenna and a processor. The processor has a plurality of ports: a first input port coupled to a first portion of the antenna; a first output port coupled in series to a first resistor and a second resistor to ground, with the junction of the first resistor and second resistor coupled to the first portion of the antenna either directly or through a fifth resistor; a second output port coupled through a third resistor to the first portion of the antenna; and a second input port coupled to a second portion of the antenna and through a fourth resistor to ground, either directly or through a switch. The processor is operable to activate and deactivate the appropriate ports to put the processor in one of three operating modes: an AC detection mode, a self-test mode, and a continuity test mode.

A method of testing and using the antenna by operating in a plurality of modes, including an operating mode, is also disclosed. The method operates in one of three modes. In a first mode, an AC signal from a first output port is injected into circuitry at a first leg of the antenna and the presence of the AC signal is detected at a first input port. In a second mode, a voltage from a second output port is injected through the antenna and the presence of a portion of the voltage at a second input port is detected. In a third mode, a signal from the antenna is received at the first input port.

Another system is also disclosed. This system comprises an antenna having a first portion and a second portion and a processor. The processor has: a first input port coupled to the first portion of the antenna; a first output port coupled in series to a first resistor coupled to the first portion of the antenna and to ground via a second resistor; and a second output port coupled through a third resistor to the second portion of the antenna.

An additional system disclosed has an antenna having a first portion and a second portion; and a processor. The processor has: a first input port coupled to the first portion of the antenna; a first output port coupled in series to a first resistor coupled to the first portion of the antenna and to ground via a second resistor; a second output port coupled through a third resistor to a second portion of the antenna; and a second input port coupled to the first portion of the antenna and through a fourth resistor to ground.

Both the foregoing overview and the following example embodiments are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

FIG. 1 illustrates an embodiment of a non-contact voltage detector 100 and self-test circuitry. Testing system 100 comprises a processor 105 having input I1, output O1, input I2, and output O2. The processor may be a microprocessor, microcontroller, digital signal processor, or replaced with equivalent analog and/or digital circuitry to affect the desired performance of the circuit. Input I1 is coupled to a switch S1 110 in processor 105 and to a first portion of antenna 150. Output O1 is coupled to a switch S2 120 in processor 105 and via resistor R1 160 to the first portion of antenna 150 and input I1. Resistor R1 160 is also coupled at the same node as the coupling to antenna 150 via resistor R2 170 to ground. Output O2 is coupled in series with resistor R3 180 through antenna 150 to input 2 I2 and through resistor R4 190 to ground. Output O2 is also coupled to switch S3 130, while Input I2 is also coupled to switch S4 140.

Input 1 via switch S1 110 serves to detect AC voltage. Output 1 O1 via switch S2 120 is used to output a self-test voltage. Output 2 O2 is used to provide a continuity source voltage. And, input I2 is used to detect continuity through antenna 150. The use of this circuit will be described in more detail below in FIGS. 2-4.

Figure 2:
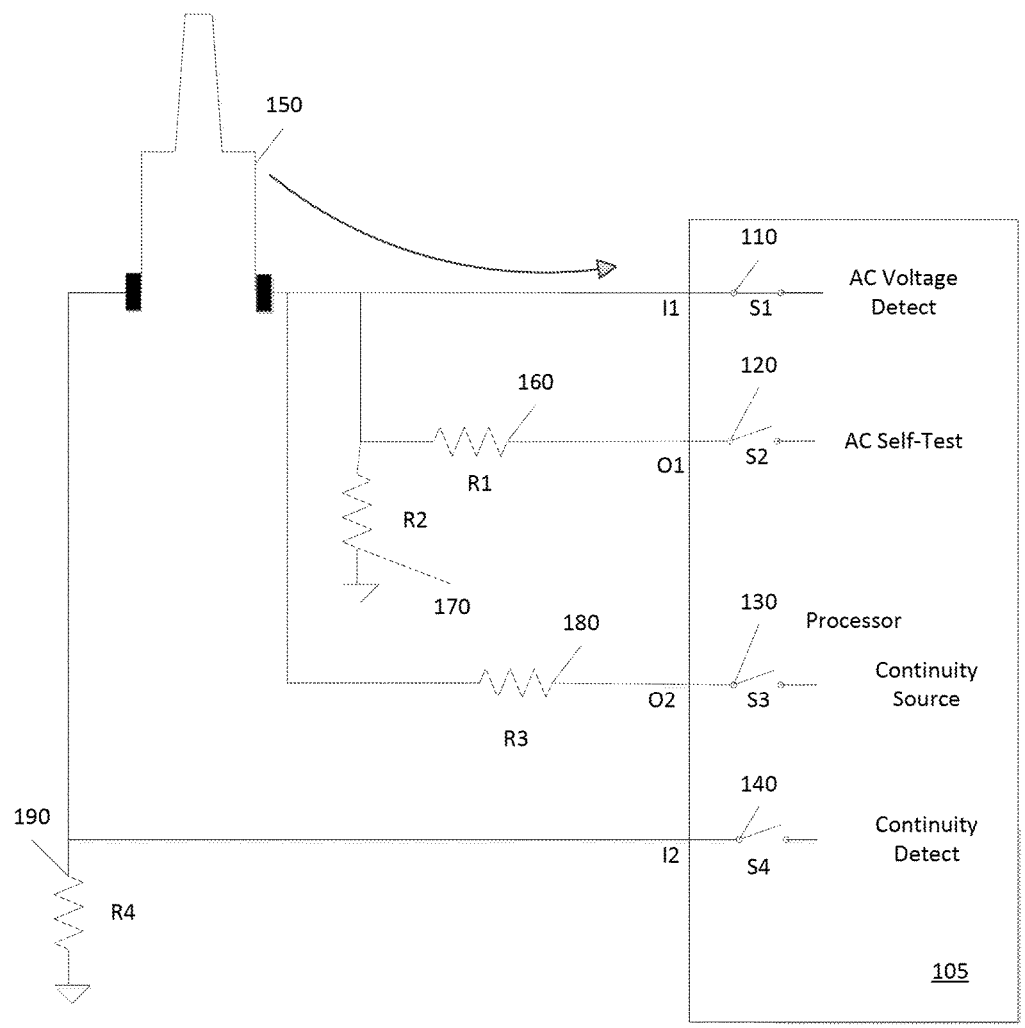
FIG. 2 illustrates an embodiment of the non-contact voltage detector 100 and self-test circuitry operating in an AC detection mode.

FIG. 2 illustrates an embodiment of the non-contact voltage detector 100 and self-test circuitry operating in an AC detection mode. When operating in AC detection mode, switches S2 120, S3 130, and S4 140 are all open; switch S1 110 is closed. In AC detection mode, if there is an AC voltage being capacitively coupled to the antenna it is received by the processor 105 and the AC voltage may be indicated to the user. The indication may be in the form of lights, sounds, and/or a display of the voltage detected.

Figure 3:
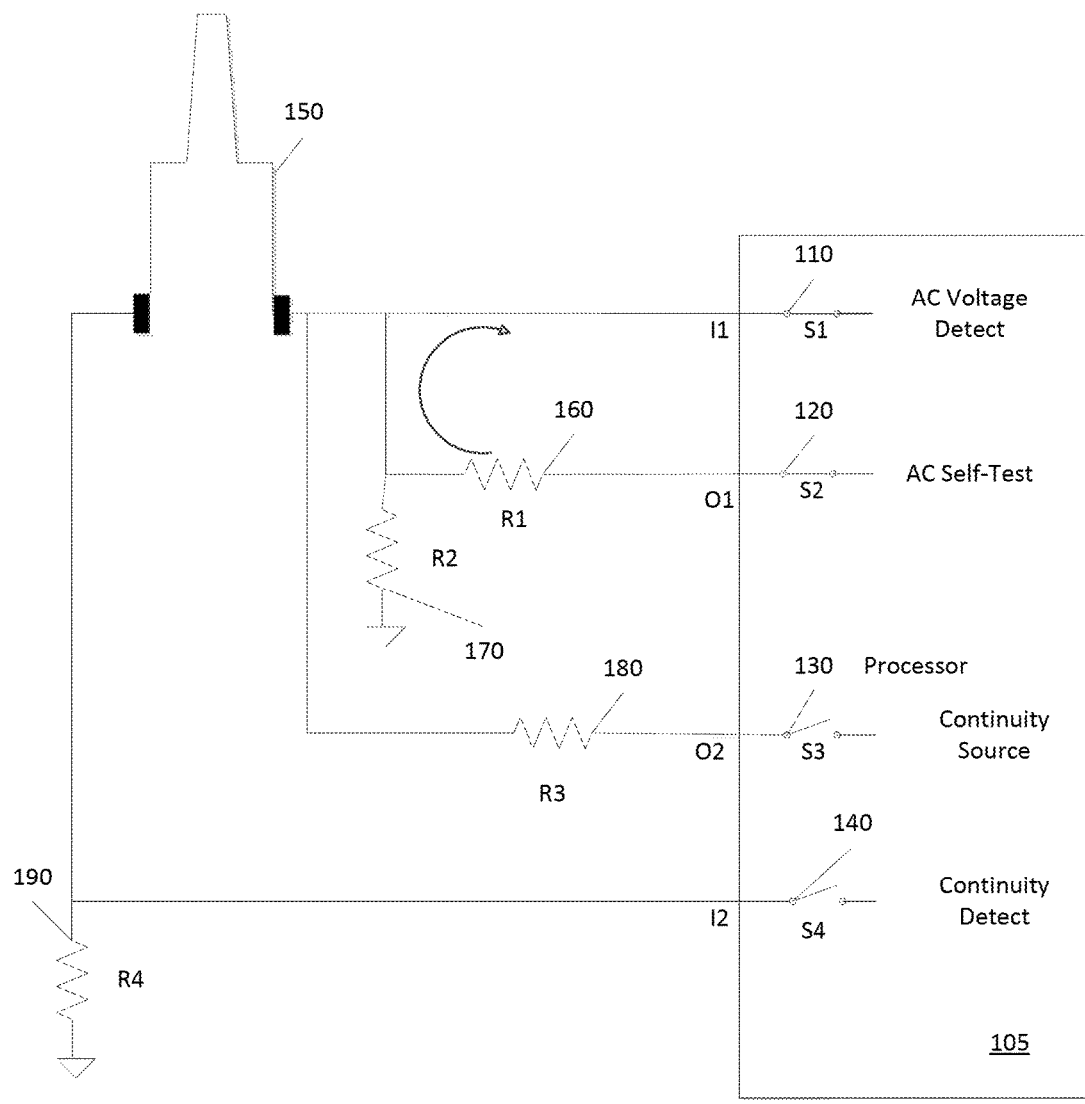
FIG. 3 illustrates an embodiment of the non-contact voltage detector 100 and self-test circuitry operating in an AC self-test mode.

FIG. 3 illustrates an embodiment of the non-contact voltage detector 100 and self-test circuitry operating in an AC self-test mode. In AC self-test mode, switches S1 110 and S2 120 are closed; switches S3 130 and S4 140 are open. This second port may be configured as a digital output port when self-testing the AC signal path. Port S2 120 is alternately coupled between battery voltage, or some other stepped-up or stepped-down battery voltage, and circuit common. This produces a simulated AC signal that is applied to port I1 via resistor R1 160. The AC signal will also flow through resistor R2 170 to ground. Resistors R1 160 and R2 170 are sized to provide a desired test amplitude. Unlike prior art systems, this simulated AC self-test signal does not flow through the antenna. The processor 105 will examine the received signal via switch S1 110 to determine whether the AC self-test is successful or has failed. If the AC self-test fails, the user of the unit may be notified by a light, a buzzer, or some other indication. In addition, operation of the unit in AC detection mode may be disabled and the user notified.

Figure 4:
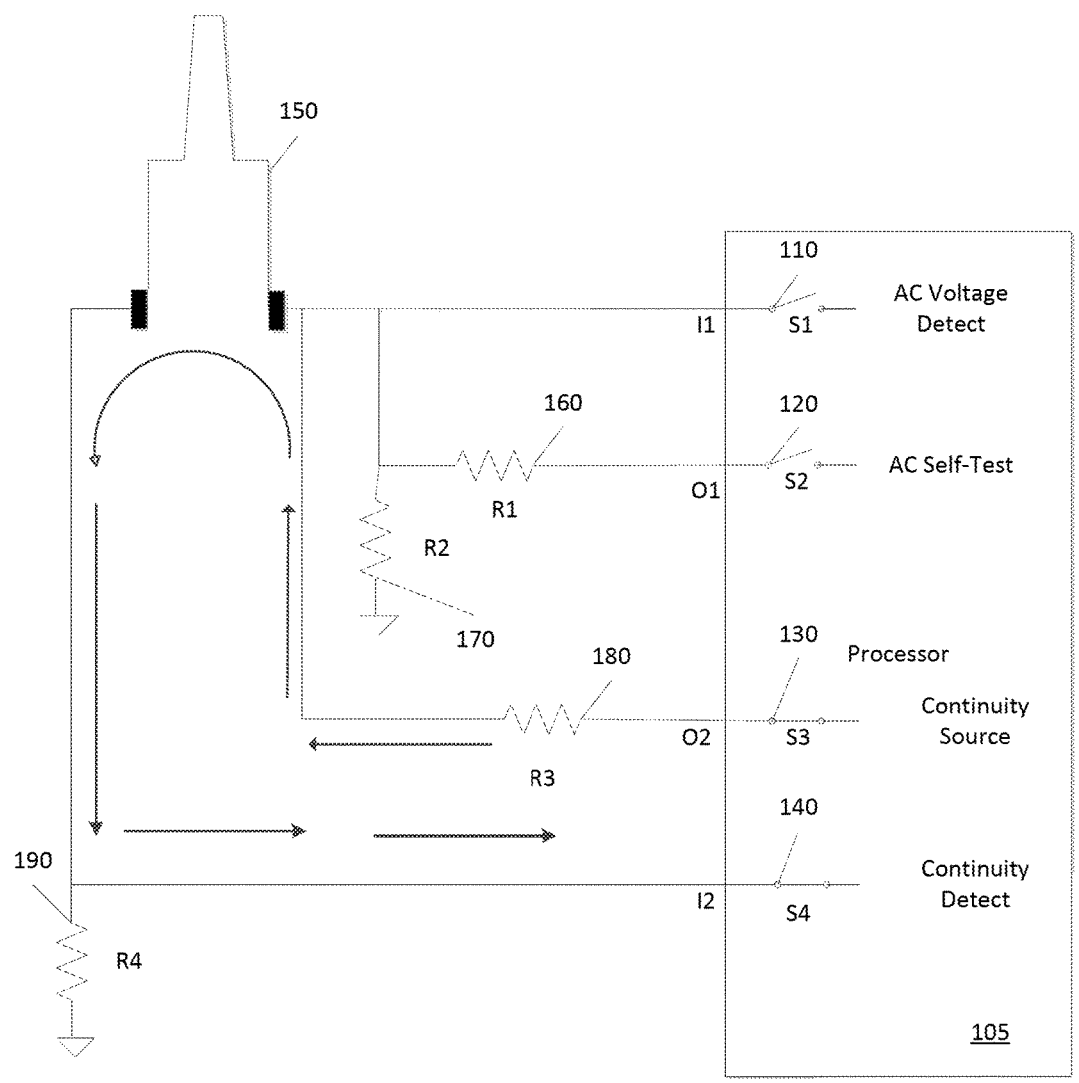
FIG. 4 illustrates an embodiment of the non-contact voltage detector 100 and self-test circuitry operating in a continuity test mode.

FIG. 4 illustrates an embodiment of the non-contact voltage detector 100 and self-test circuitry operating in a continuity test mode. In continuity test mode, switches S1 110 and S2 120 are open; switches S3 130 and S4 140 are closed. The port O2 provides the source of the antenna continuity test signal. This port is coupled to battery voltage, or some stepped-up or stepped down battery voltage, internal to processor 105. The port O2 is coupled via resistor R3 180 to the first portion of antenna 150. An expected voltage value, based on the output voltage at port O2 and the relative sizes of resistors R3 180 and R4 190, would then be detected by processor 105 via input I2 and switch S4 140. Failure of either connection between the first antenna portion and the printed circuit board, or between the second antenna portion and the printed circuit board will result in a deviation from the expected value being measured at input I2. This continuity test may be conducted with a test current several orders of magnitude greater than the normal injected signal, and may produce a more reliable and consistent result in finding marginal connections. This is an improvement to prior art systems that fail to check continuity through the antenna, thus if the antenna, or probe, breaks in prior art systems, the prior art systems may still pass a self-test.

Figure 5:
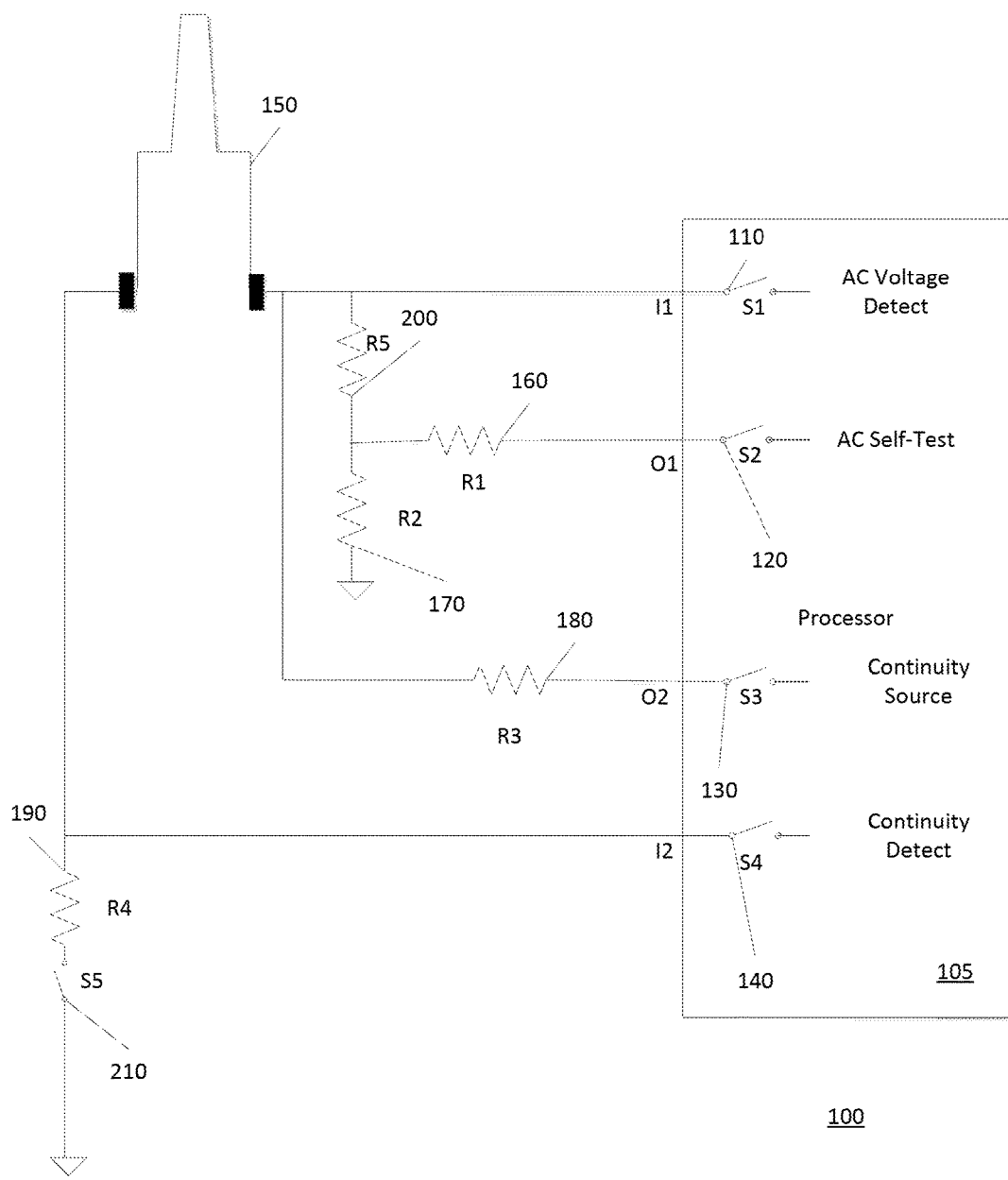
FIG. 5 illustrates an embodiment of the non-contact voltage detector 100 and self-test circuitry with modifications to improve sensitivity, reduce circuit loading, and facilitate component selection.

FIG. 5 is an embodiment of the non-contact voltage detector 100 and self-test circuitry similar to FIG. 1 with improvements to increase sensitivity, reduce circuit loading, and facilitate component selection. Those skilled in the art would recognize that resistors R2 170 and R4 190 have very high values to avoid reducing the sensitivity of the detection circuitry. The addition of R5 200, having a high resistance value, eliminates the sensitivity reduction that could be caused by selection of convenient values for R1 160 and R2 170 in establishing the magnitude of the AC self-test signal. The addition of switch S5 210 isolates resistor R4 190 except when the continuity test is being performed. Switch S5 210, which is open in all modes except during the continuity test, may be an analog switch, a field effect transistor, or any other suitable low-leakage discrete or integrated component. It may be activated by output O2 or other convenient means. Those skilled in the art would recognize that the addition of resistor R5 200 and switch S5 210 do not alter the fundamental principles of operation disclosed in reference to FIGS. 2-4.

Figure 6:
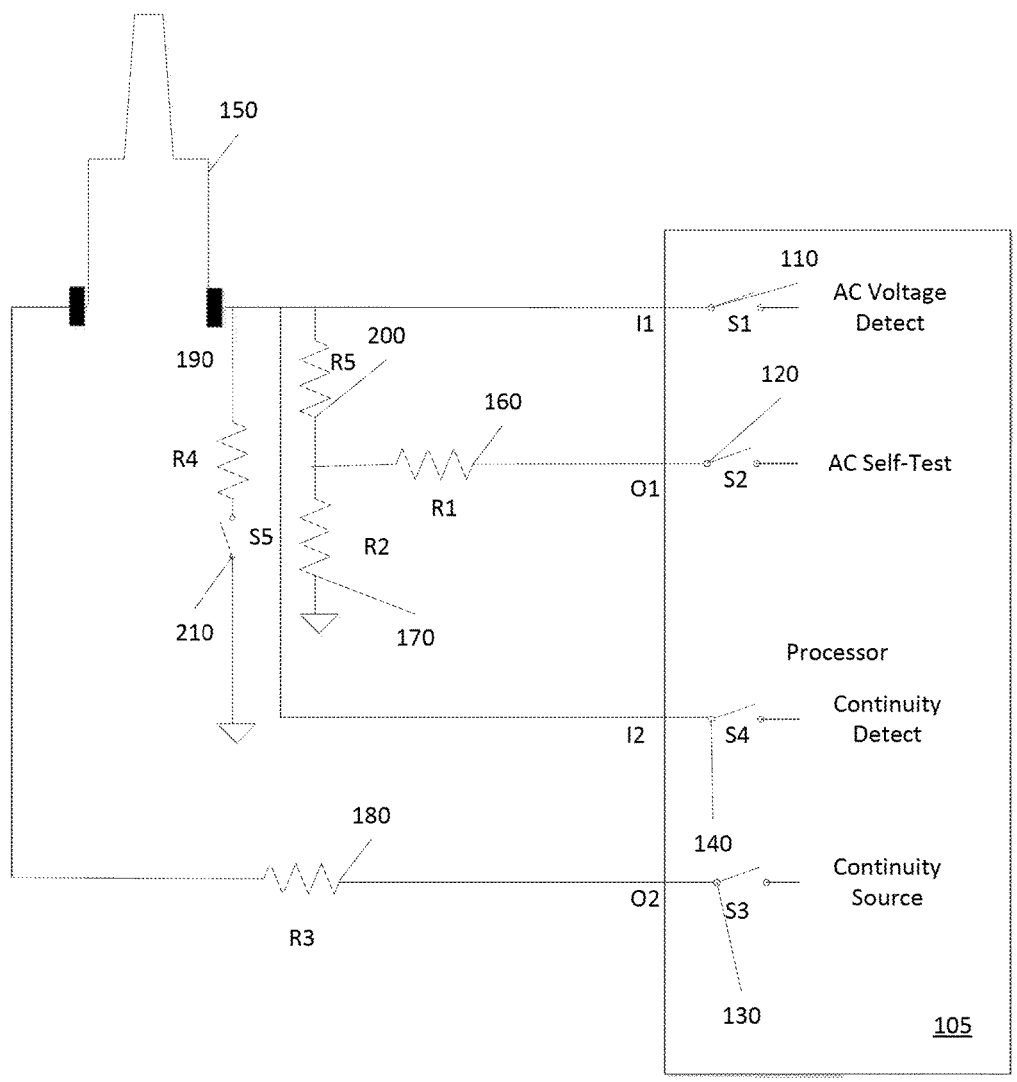
FIG. 6 is a second embodiment of a non-contact voltage detector and self-test circuitry.

FIG. 6 is an embodiment of the non-contact voltage detector 100 and self-test circuitry similar to FIG. 5, except that the antenna connections for the continuity test mode are reversed. Port O2 is coupled via resistor R3 180 to the second portion of antenna 150 rather than the first portion. Additionally, the continuity test mode components consisting of resistor R4 190 in series with switch S5 210, along with input I2 are coupled to the first portion of the antenna rather than the second portion. The operation of the continuity test mode, including the operation of all five switches, is unchanged from the previous descriptions.

Figure 7:
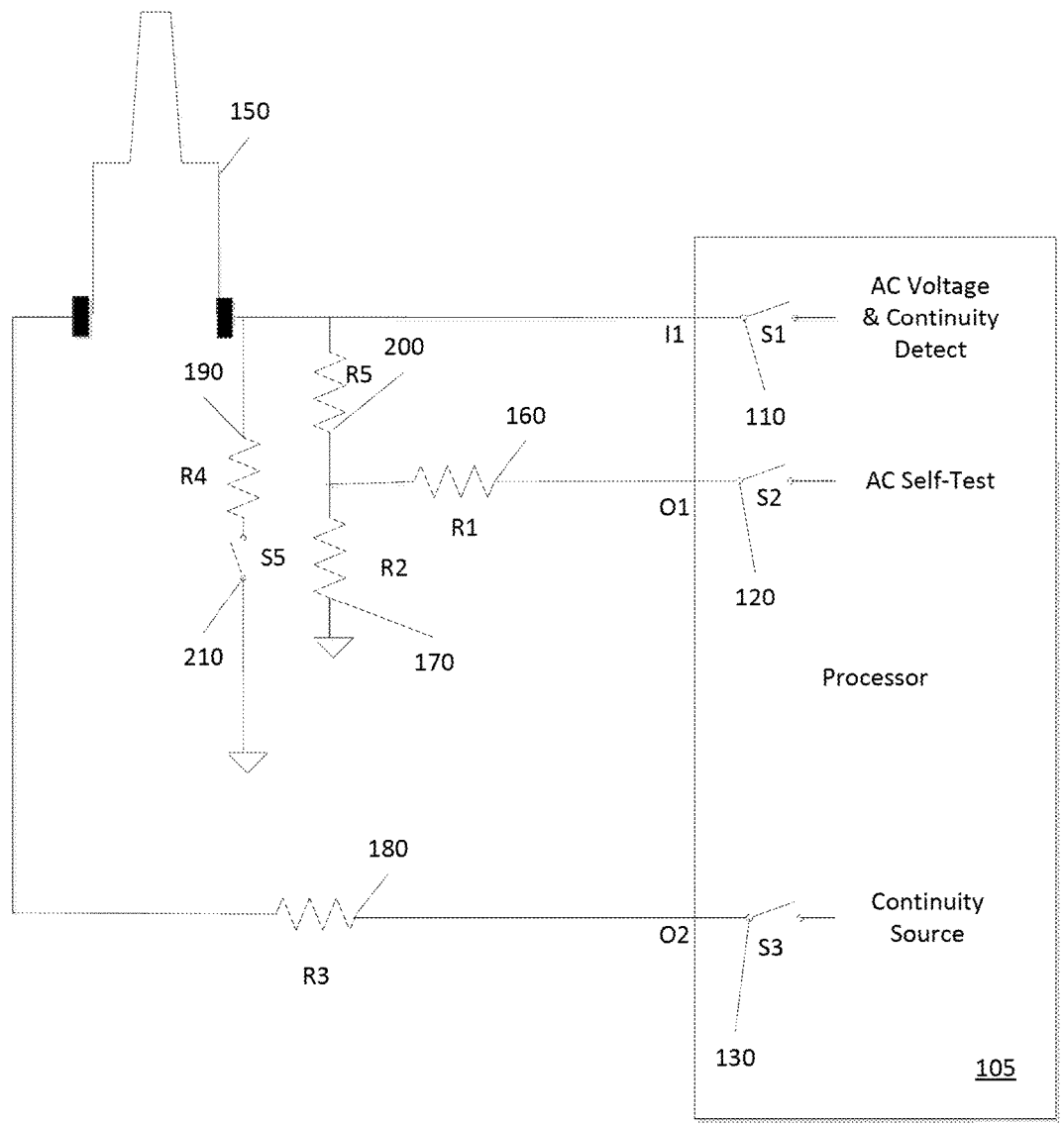

FIG. 7 is an embodiment of the non-contact voltage detector 100 and self-test circuitry similar to FIG. 6, except that input I1 is performing both the AC Voltage Detect function and the Continuity Detect function. This has the advantage of requiring one less input on the processor 105. In this embodiment, input I2 is not used and switch S1 110 on input I1 is closed in all operating modes and is thus optional. Switches S2 120 and S3 130 operate as previously described: switch S2 120 is closed and switch S3 130 is open when operating in an AC self-test mode; and switch S2 120 is open and switch S3 130 is closed when operating in a continuity test mode.

A user of the system 100 may readily switch between operating modes through the use of mechanical switches, buttons or other methods. The system 100 can transition from a first operating mode to any other operating mode. However, should the system fail the self-test mode or the continuity test mode, the system 100 may be disabled and unable to enter AC detection mode.

The system may also periodically enter either or both of the testing modes for very short duration while a user has put the system into AC detection mode. In this way, the system may periodically check, e.g., every two seconds, its integrity, even during operation. Through this feature, when the user places the system in AC detection mode, it may initially perform an AC self-test and a continuity test. It would then enter into AC detection mode and periodically, for example, every two seconds, briefly (on the order of milliseconds) enter into either or both of the AC self-test mode and the continuity detect mode. In this way, the system would periodically check its integrity.

Embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including, but not limited to, to mechanical, optical, and quantum technologies. In addition, embodiments of the disclosure may be practiced within a general purpose computer or in any other circuits or systems. Throughout the above discussion, reference has been made to switches, those skilled in the art after reading this disclosure would appreciate that active components, such as op-amps or transistors, could also be used.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
    an antenna having a first portion and a second portion; and
    a processor having:
        a first input port coupled to the first portion of the antenna;
        a first output port coupled in series to a first resistor coupled to the first portion of the antenna and to ground via a second resistor;
        a second output port coupled through a third resistor to the first portion of the antenna; and
        a second input port coupled to the second portion of the antenna and through a fourth resistor to ground, wherein when the processor is in an AC self-test mode, the first input port and the first output port are both active, while the second output port and the second input port are both inactive, wherein when the processor is in a continuity test mode, the first input port and the first output port are both inactive, while the second output port and the second input port are both active, and wherein in the continuity test mode a test signal is injected through the antenna.

2. The system of claim 1, wherein when the processor is in an AC detection mode, the first input port is active and the first output port, second output port, and second input port are inactive.

3. The system of claim 1, wherein in the AC self-test mode, an alternating voltage is placed on the first output port.

4. The system of claim 3, wherein the first input port detects the presence of the alternating voltage.

5. The system of claim 3, wherein when the first input port fails to detect the presence of an alternating voltage a self-test failure is indicated.

6. The system of claim 1, wherein in the continuity mode, a voltage is placed on the second output port.

7. The system of claim 6, wherein a portion of the voltage is detected at the second input port.

8. The system of claim 6, wherein when an incorrect portion of the voltage is detected at the second input port a continuity test failure is indicated.

9. A method of testing an antenna, comprising:
    in a first mode, injecting an AC signal from a first output port of a processor into circuitry at a first portion of the antenna and detecting the presence of the AC signal at a first input port of the processor, wherein the first input port is coupled to the first portion of the antenna, wherein the first output port is coupled in series to a first resistor coupled to the first portion of the antenna and to ground via a second resistor, and wherein when the processor is in an AC self-test mode, the first input port and the first output port are both active, while the second output port and the second input port are both inactive; and
    in a second mode, injecting a voltage from a second output port of the processor through the first portion of the antenna and detecting the presence of the voltage on a second portion of the antenna at a second input port of the processor, wherein the second output port is coupled through a third resistor to a second portion of the antenna, wherein the second input port is coupled to the first portion of the antenna and through a fourth resistor to ground, wherein when the processor is in a continuity test mode, the first input port and the first output port are both inactive, while the second output port and the second input port are both active, and wherein in the continuity test mode a test signal is injected through the antenna.

10. The method of claim 9, further comprising in the first mode, when the AC signal is not detected at the first input port, providing an indication that an AC self-test has failed.

11. The method of claim 9, further comprising in the second mode, when a portion of the voltage received at the second input port does not equal an expected voltage, providing an indication that a continuity test has failed.

12. A system, comprising:
    an antenna having a first portion and a second portion; and
    a processor having:
        a first input port coupled to the first portion of the antenna;
        a first output port coupled in series to a first resistor coupled to the first portion of the antenna and to ground via a second resistor;
        a second output port coupled through a third resistor to a second portion of the antenna; and
        a second input port coupled to the first portion of the antenna and through a fourth resistor to ground, wherein when the processor is in an AC self-test mode, the first input port and the first output port are both active, while the second output port and the second input port are both inactive, and wherein when the processor is in a continuity test mode, the first input port and the first output port are both inactive, while the second output port and the second input port are both active, wherein in the continuity test mode a test signal is injected through the antenna.

13. The system of claim 12, wherein in the AC self-test mode an alternating voltage is placed on the first output port.

14. The system of claim 13, wherein the first input port detects the presence of the alternating voltage.

15. The system of claim 14, wherein when the first input port fails to detect the presence of an alternating voltage a self-test failure is indicated.

16. The system of claim 12, wherein in the continuity test mode a voltage is placed on the second output port.

17. The system of claim 16, wherein a portion of the voltage is detected at the second input port.

18. The system of claim 17, wherein when an incorrect portion of the voltage is detected at the second input port a continuity test failure is indicated.

* * * * *